(12) United States Patent
Kani et al.

(10) Patent No.: US 12,388,473 B2
(45) Date of Patent: Aug. 12, 2025

(54) HIGH FREQUENCY MODULE AND COMMUNICATION APPARATUS

(71) Applicant: Murata Manufacturing Co., Ltd., Kyoto (JP)

(72) Inventors: Hiroyuki Kani, Kyoto (JP); Takuma Kuroyanagi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 199 days.

(21) Appl. No.: 18/317,363

(22) Filed: May 15, 2023

(65) Prior Publication Data

US 2023/0283306 A1  Sep. 7, 2023

Related U.S. Application Data

(63) Continuation of application No. PCT/JP2021/046365, filed on Dec. 15, 2021.

(30) Foreign Application Priority Data

Dec. 28, 2020 (JP) .................................. 2020-219307

(51) Int. Cl.
*H04B 1/00* (2006.01)

(52) U.S. Cl.
CPC ......... *H04B 1/0078* (2013.01); *H04B 1/0042* (2013.01); *H04B 1/0057* (2013.01)

(58) Field of Classification Search
CPC .. H04B 1/0078; H04B 1/0042; H04B 1/0057; H04B 1/00; H04B 1/006; H04B 1/16;
(Continued)

(56) References Cited

U.S. PATENT DOCUMENTS

2019/0214355 A1    7/2019   Nishikawa
2020/0007096 A1*   1/2020   Kita ..................... H03H 7/46
(Continued)

FOREIGN PATENT DOCUMENTS

JP   2020-126921 A    8/2020
WO   2018/110393 A1   6/2018
(Continued)

OTHER PUBLICATIONS

International Search Report for PCT/JP2021/046365 dated Mar. 8, 2022.

*Primary Examiner* — Tanmay K Shah
(74) *Attorney, Agent, or Firm* — McDonald Hopkins LLC

(57) ABSTRACT

The total sum of wiring lengths between reception filters and low-noise amplifiers is reduced. A high frequency module includes a mounting board, a plurality of inductors, a plurality of reception filters, and an IC component. The plurality of inductors are mounted on a first main surface of the mounting board. The plurality of reception filters are mounted on the first main surface of the mounting board. The IC component is mounted on a second main surface of the mounting board and includes a low-noise amplifier. A rectangular region in which the plurality of inductors are positioned overlaps with the IC component when viewed in plan from a thickness direction of the mounting board. An electronic component that is closest to each of three or more sides out of four sides of the rectangular region is at least one of the plurality of reception filters.

9 Claims, 5 Drawing Sheets

(58) Field of Classification Search
CPC ... H04B 1/18; H04B 1/38; H04B 1/40; H04B 1/44; H04B 1/525; H01L 25/00; H01L 25/10; H01L 25/18; H01P 5/08; H01Q 1/50
USPC ...................................................... 455/552.1
See application file for complete search history.

(56) References Cited

U.S. PATENT DOCUMENTS

2020/0251459 A1   8/2020  Tsuda et al.
2020/0403596 A1*  12/2020 Yamaguchi .......... H04B 1/0057

FOREIGN PATENT DOCUMENTS

WO       2018/168500 A1    9/2018
WO       2019/188875 A1    10/2019

* cited by examiner

HIGH FREQUENCY MODULE AND COMMUNICATION APPARATUS

CROSS REFERENCE TO RELATED APPLICATION

This is a continuation of International Application No. PCT/JP2021/046365 filed on Dec. 15, 2021 which claims priority from Japanese Patent Application No. 2020-219307 filed on Dec. 28, 2020. The contents of these applications are incorporated herein by reference in their entireties.

BACKGROUND ART

Technical Field

The present disclosure relates, in general, to high frequency modules and communication apparatuses and, more particularly, to a high frequency module including a plurality of inductors and a plurality of reception filters and a communication apparatus including the high frequency module.

High frequency modules including an inductor and a filter have been known (see, for example, Patent Document 1). In a high frequency module described in Patent Document 1, a filter unit and an inductor are provided on a front surface of a substrate, and a switch IC is provided on a rear surface of the substrate.

The switch IC includes two switch units and an amplification unit. The inductor is connected between the switch units and the amplification unit.

A switch unit includes an input terminal and an output terminal. The input terminal is connected to an antenna element, and the output terminal is connected to an input terminal of the filter unit.

Patent Document 1: International Publication No. 2018/110393

BRIEF SUMMARY

Due to the recent trend toward multiple bands, there have been demands for modules including a plurality of reception filters.

In the existing high frequency module described in Patent Document 1, however, the total sum of wiring lengths between reception filters and a low-noise amplifier is large. Thus, path loss may be large. For example, in the case where a high frequency module includes two reception filters (a first reception filter and a second reception filter), the "total sum of wiring lengths between reception filters and a low-noise amplifier" represents the total sum of wiring length between the first reception filter and the low-noise amplifier and wiring length between the second reception filter and the low-noise amplifier.

The present disclosure provides a high frequency module and a communication apparatus in which the total sum of wiring lengths between reception filters and a low-noise amplifier is reduced.

A high frequency module according to an aspect of the present disclosure includes a mounting board, a plurality of inductors, a plurality of reception filters, and an IC component. The mounting board has a first main surface and a second main surface that face each other. The plurality of inductors are mounted on the first main surface of the mounting board. The plurality of reception filters are mounted on the first main surface of the mounting board. The IC component is mounted on the second main surface of the mounting board and includes a low-noise amplifier. Each of the plurality of inductors corresponds to part of the plurality of reception filters and is connected to a corresponding reception filter and the low-noise amplifier. A rectangular region in which the plurality of inductors are positioned overlaps with the IC component when viewed in plan from a thickness direction of the mounting board. An electronic component that is closest to each of three or more sides out of four sides of the rectangular region is at least one of the plurality of reception filters.

A communication apparatus according to an aspect of the present disclosure includes the high frequency module and a signal processing circuit. The signal processing circuit processes a signal passing through the high frequency module.

In a high frequency module and a communication apparatus according to the above-mentioned aspects of the present disclosure, the total sum of wiring lengths between reception filters and a low-noise amplifier can be reduced.

DETAILED DESCRIPTION

Hereinafter, a high frequency module and a communication apparatus according to an embodiment will be described with reference to drawings. FIGS. 1 to 3 and FIG. 5, which will be referred to in the embodiment and the like described below, are schematic diagrams, and ratios of the sizes and the thicknesses of component elements in these figures do not necessarily correspond to the actual dimensional ratios.

Embodiment (1) High Frequency Module

A configuration of a high frequency module 1 according to an embodiment will be described with reference to drawings.

Figure 1:
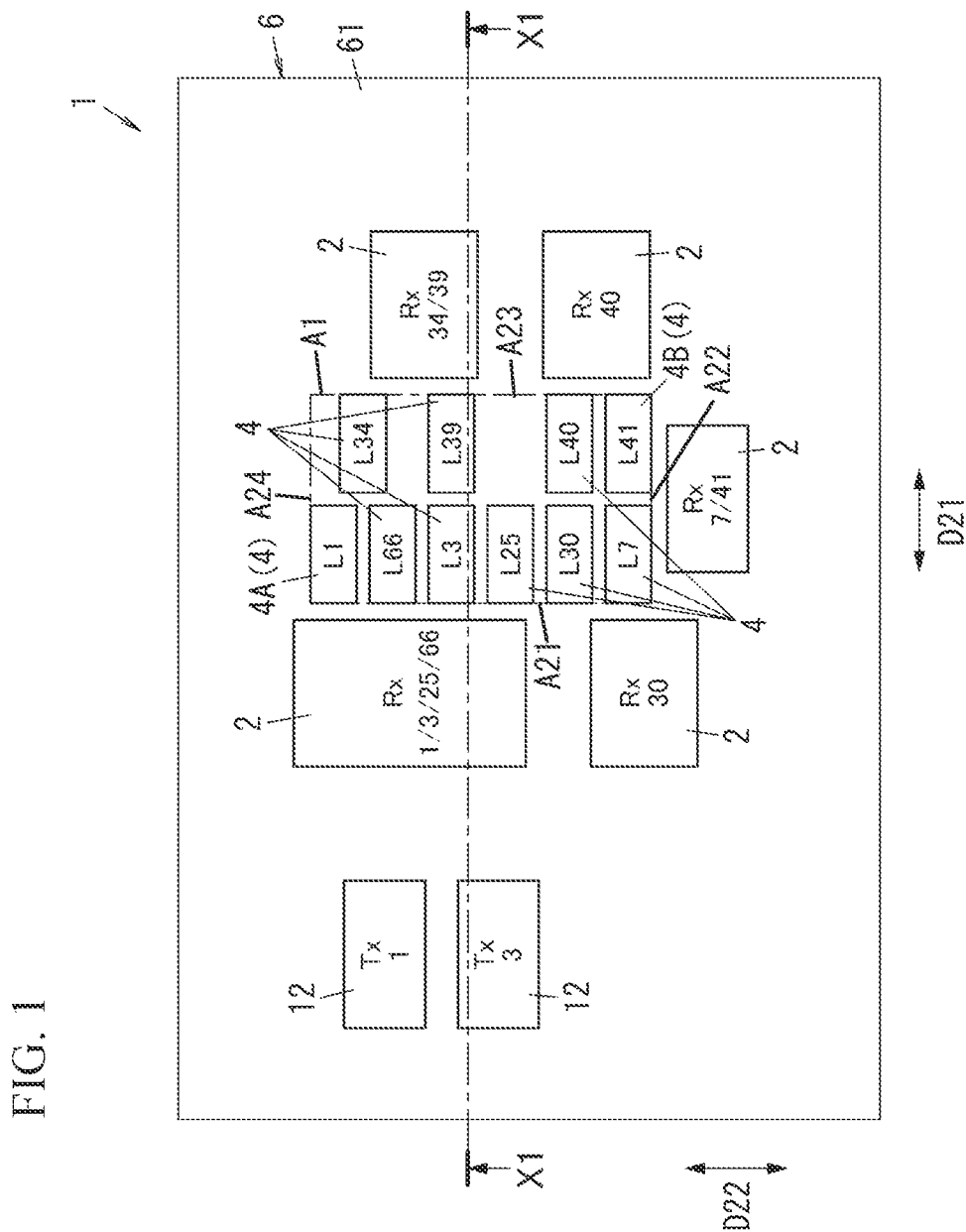
FIG. 1 is a top view of a high frequency module according to an embodiment.
Figure 2:
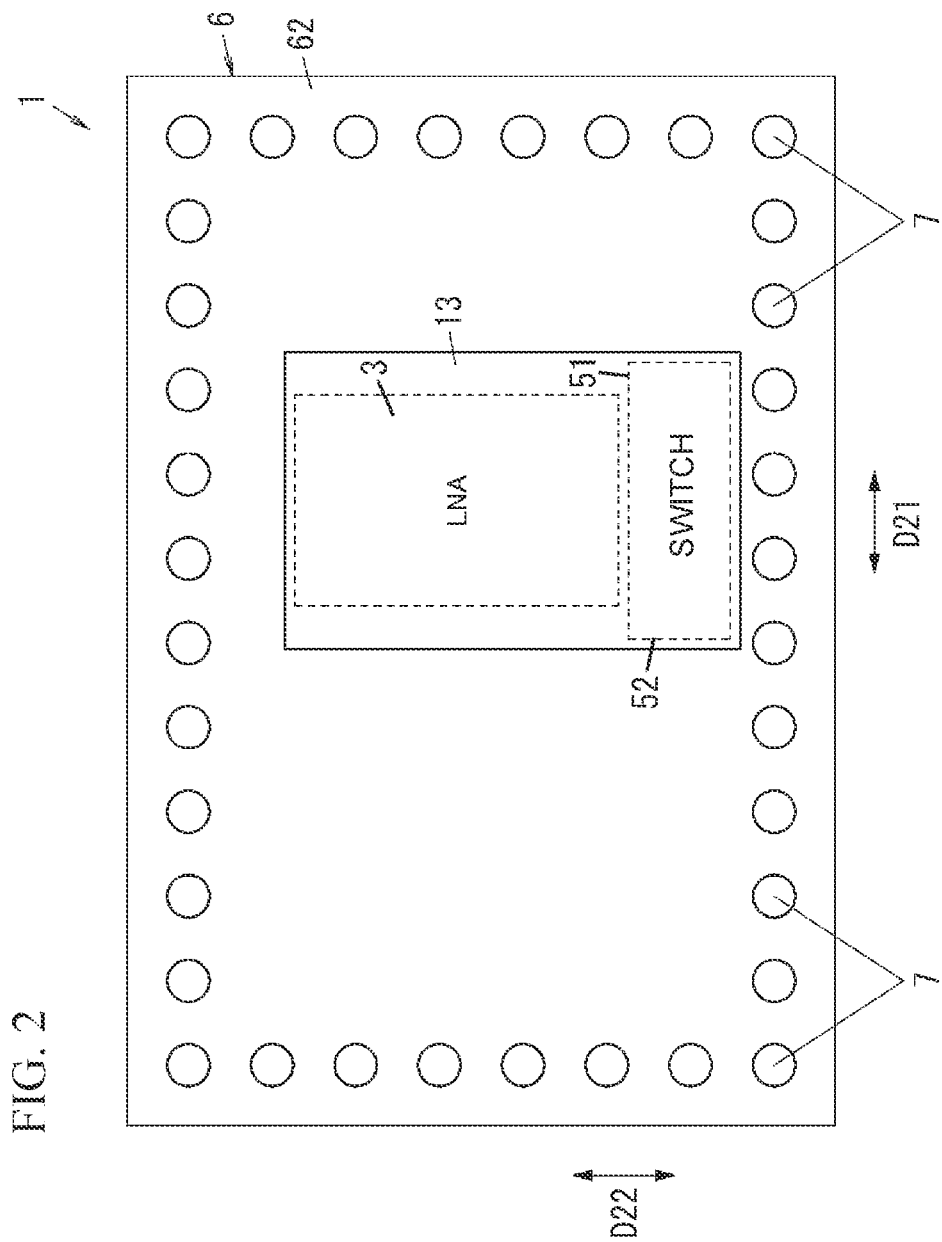
FIG. 2 is a bottom view of the high frequency module.
Figure 4:
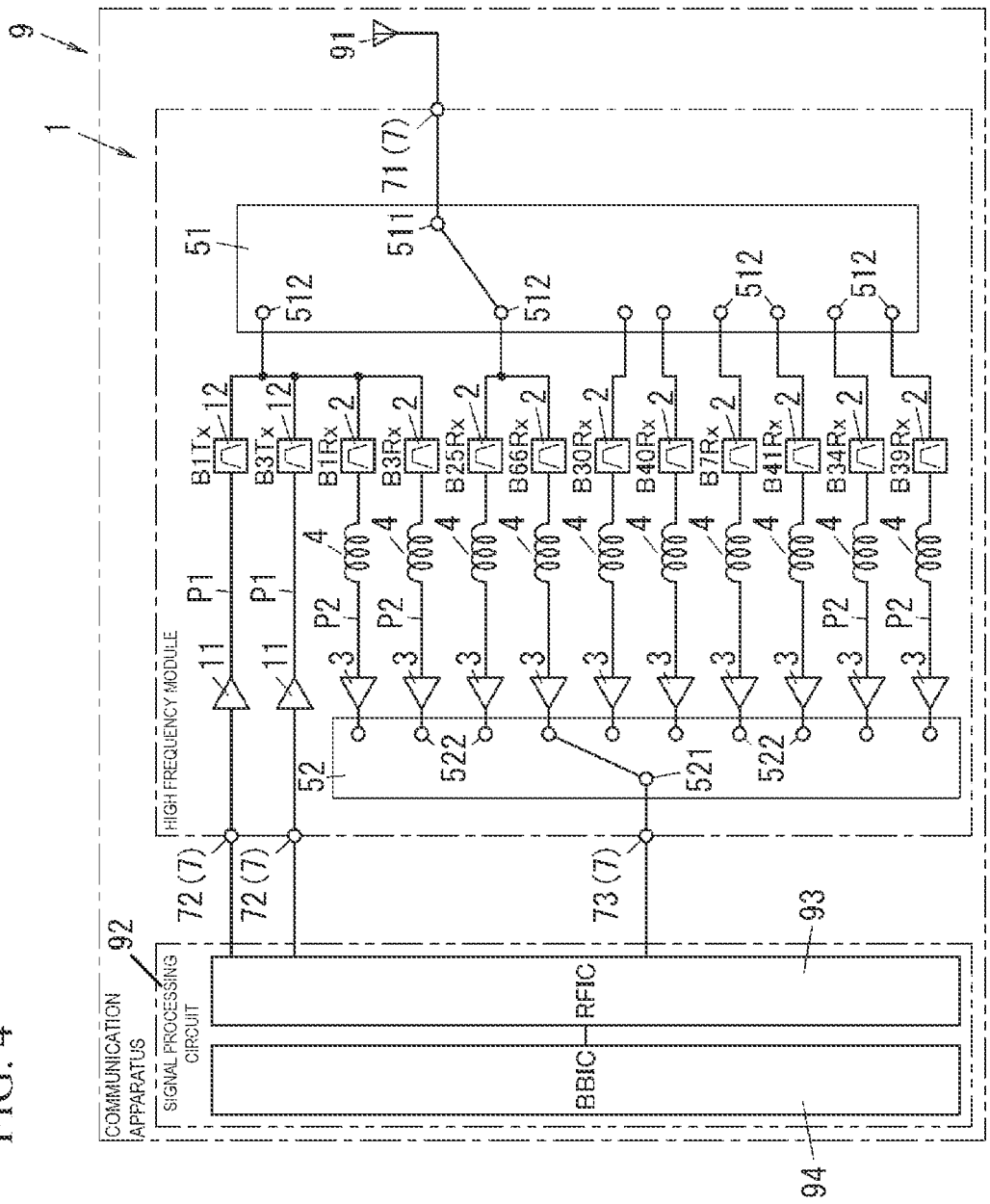
FIG. 4 is a circuit configuration diagram of the high frequency module and a communication apparatus according to the embodiment.

The high frequency module 1 according to this embodiment includes, as illustrated in FIGS. 1, 2, and 4, a plurality of (in the illustrated example, two) power amplifiers 11, a plurality of (in the illustrated example, two) transmission filters 12, a plurality of (in the illustrated example, ten) reception filters 2, a plurality of (in the illustrated example, ten) low-noise amplifiers 3, a plurality of (in the illustrated example, ten) inductors 4, a first switch 51, and a second switch 52.

Figure 3:
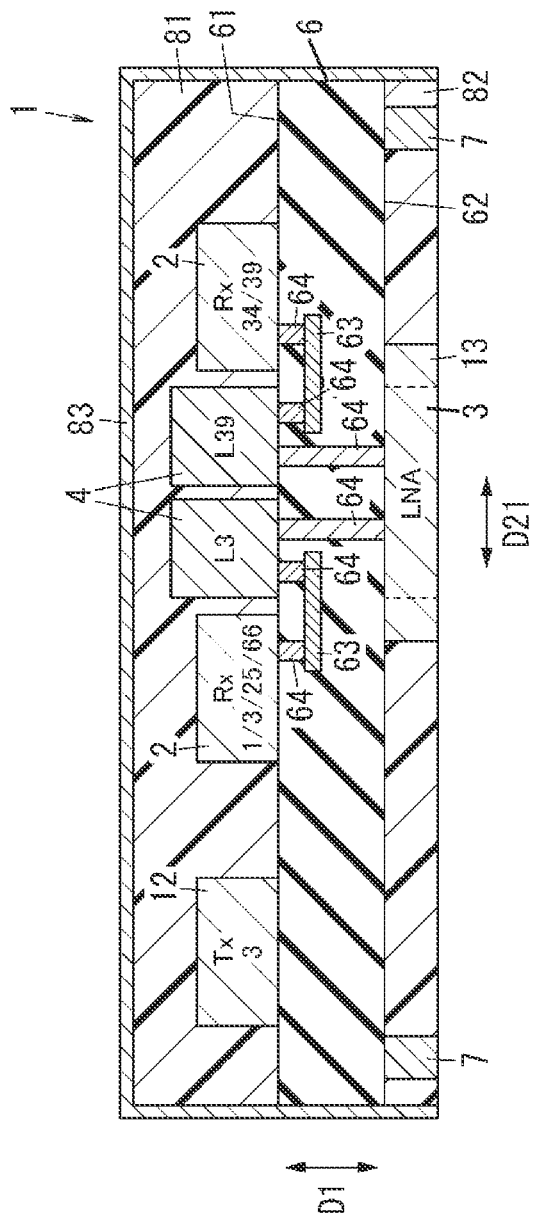
FIG. 3 is a cross-section view of the high frequency module taken along line X1-X1 in FIG. 1.

The high frequency module 1 also includes, as illustrated in FIGS. 1 to 3, a mounting board 6, a plurality of external connection terminals 7, a first resin layer 81, a second resin layer 82, and a shield layer 83.

An IC component 13 including the plurality of low-noise amplifiers 3, the first switch 51, and the second switch 52 is provided at the mounting board 6.

The high frequency module 1 is used for, for example, a communication apparatus 9, as illustrated in FIG. 4. The communication apparatus 9 is, for example, a mobile phone such as a smartphone. The communication apparatus 9 is not necessarily a mobile phone and may be, for example, a wearable terminal such as a smartwatch. The high frequency module 1 is, for example, a module capable of supporting the fourth generation mobile communications (4G) standards, the fifth generation mobile communications (5G) standards, and the like. The 4G standards are, for example, third generation partnership project (3GPP) long term evolution (LTE) standards. The 5G standards are, for example, 5G new radio (NR). The high frequency module 1 is, for example, a module capable of supporting carrier aggregation and dual connectivity.

The communication apparatus 9 performs communication using a plurality of communication bands. More particularly, the communication apparatus 9 transmits transmission signals of a plurality of communication bands and receives reception signals of a plurality of communication bands.

Part of the transmission signals and the reception signals of the plurality of communication bands is a frequency division duplex (FDD) signal. The transmission signals and the reception signals of the plurality of communication bands are not limited to FDD signals and may be time division duplex (TDD) signals. FDD is a wireless communication technique for performing transmission and reception by allocating different frequency bands to transmission and reception in wireless communication. TDD is a wireless communication technique for allocating the same frequency band to transmission and reception in wireless communication and switching between transmission and reception by time.

(2) Circuit Configuration of High Frequency Module

A circuit configuration of the high frequency module 1 according to this embodiment will be described below with reference to FIG. 4.

(2.1) Power Amplifier

The plurality of power amplifiers 11 illustrated in FIG. 4 are amplifiers that amplify different transmission signals. Each of the power amplifiers 11 is provided between a signal input terminal 72 and a transmission filter 12 on a transmission path P1 that connects an antenna terminal 71, which will be described later, and the signal input terminal 72. The power amplifier 11 includes an input terminal (not illustrated in drawings) and an output terminal (not illustrated in drawings). The input terminal of the power amplifier 11 is connected to an external circuit (for example, a signal processing circuit 92) with the signal input terminal 72 interposed therebetween. The output terminal of the power amplifier 11 is connected to the transmission filter 12. For example, the power amplifier 11 is controlled by a controller (not illustrated in drawings). The power amplifier 11 can be connected to the transmission filter 12 directly or indirectly. For example, the power amplifier 11 may be connected to the transmission filter 12 with an output matching circuit (not illustrated in drawings) interposed therebetween. The output matching circuit is provided between the power amplifier 11 and the transmission filter 12 on the transmission path P1. The output matching circuit matches the impedance between the power amplifier 11 and the transmission filter 12.

(2.2) Transmission Filter

The plurality of transmission filters 12 illustrated in FIG. 4 are filters that allow transmission signals of different communication bands to pass through. More particularly, the transmission filters 12 are provided between the power amplifiers 11 and the first switch 51 on the transmission paths P1. The transmission filters 12 allow transmission signals of transmission bands of communication bands among high frequency signals amplified by the power amplifiers 11 to pass through.

(2.3) Reception Filter

The plurality of reception filters 2 illustrated in FIG. 4 are filters that allow reception signals of different communication bands to pass through. The plurality of reception filters 2 include an nth reception filter 2 (n represents a natural number). The nth reception filter 2 is provided between the first switch 51 and an nth low-noise amplifier 3 on an nth reception path P2 that connects the antenna terminal 71 to a signal output terminal 73. The nth reception filter 2 allows a reception signal of a reception band of an nth communication band among high frequency signals input from the antenna terminal 71 to pass through.

(2.4) Low-Noise Amplifier

The plurality of low-noise amplifiers 3 illustrated in FIG. 4 are amplifiers that amplify different reception signals with low noise. In the example of FIG. 4, the plurality of low-noise amplifiers 3 correspond to the plurality of reception paths P2 in a one-to-one relationship. The plurality of low-noise amplifiers 3 include an nth low-noise amplifier 3 (n represents a natural number). The nth low-noise amplifier 3 is provided between the first switch 51 and the signal output terminal 73 on the nth reception path P2. The nth low-noise amplifier 3 includes an input terminal and an output terminal. The input terminal of the nth low-noise amplifier 3 is connected to an nth inductor 4, which will be described later. The output terminal of the nth low-noise amplifier 3 is connected to an external circuit (for example, the signal processing circuit 92) with the signal output terminal 73 interposed therebetween.

(2.5) Inductor

The plurality of inductors 4 illustrated in FIG. 4 are connected to the plurality of reception filters 2 and the plurality of low-noise amplifiers 3. More particularly, each of the plurality of inductors 4 corresponds to part of the plurality of reception filters 2 and is connected to the corresponding reception filter 2. In the example of FIG. 4, the plurality of inductors 4 correspond to the plurality of reception filters 2 in a one-to-one relationship. Furthermore, each of the plurality of inductors 4 corresponds to part of the plurality of low-noise amplifiers 3 and is connected to the corresponding low-noise amplifier 3. In the example of FIG. 4, the plurality of inductors 4 correspond to the plurality of low-noise amplifiers 3 in a one-to-one relationship. The plurality of inductors 4 include an nth inductor 4 (n represents a natural number). The nth inductor 4 is provided between the nth reception filter 2 and the nth low-noise amplifier 3 on the nth reception path P2. A first end of the nth inductor 4 is connected to the nth reception filter 2. A second end of the nth inductor 4 is connected to the nth low-noise amplifier 3.

Each of the plurality of inductors 4 configures a matching circuit that matches the impedance between the reception filter 2 and the low-noise amplifier 3. In other words, the nth inductor 4 configures an nth matching circuit that matches the impedance between the nth reception filter 2 and the nth low-noise amplifier 3.

(2.6) First Switch

The first switch 51 illustrated in FIG. 4 performs switching to a filter (at least one of a transmission filter 12 and a reception filter 2) to be connected to the antenna terminal 71 from among the plurality of transmission filters 12 and the plurality of reception filters 2. The first switch 51 is a switch for performing switching to a path to be connected to an antenna 91. The first switch 51 includes a common terminal

511 and a plurality of (in the illustrated example, eight) selection terminals 512. The common terminal 511 is connected to the antenna terminal 71. Each of the plurality of selection terminals 512 is connected to at least one of the plurality of transmission filters 12 and the plurality of reception filters 2. More particularly, each of the selection terminals 512 is connected to at least one of the output terminals of the plurality of transmission filters 12 and the input terminals of the plurality of reception filters 2.

The first switch 51 performs switching of the connection state between the common terminal 511 and the plurality of selection terminals 512. For example, the first switch 51 is controlled by the signal processing circuit 92. The first switch 51 electrically connects the common terminal 511 to at least one of the plurality of selection terminals 512 in accordance with a control signal from an RF signal processing circuit 93 in the signal processing circuit 92.

(2.7) Second Switch

The second switch 52 illustrated in FIG. 4 performs switching to a low-noise amplifier 3 to be connected to the signal output terminal 73 from among the plurality of low-noise amplifiers 3. The second switch 52 is a switch for performing switching to a path to be connected to the signal output terminal 73. The second switch 52 includes a common terminal 521 and a plurality of (in the illustrated example, ten) selection terminals 522. The common terminal 521 is connected to the signal output terminal 73. The plurality of selection terminals 522 are connected to the reception filters 2. More particularly, each of the selection terminals 522 is connected to at least one of the output terminals of the plurality of low-noise amplifiers 3.

The second switch 52 performs switching of the connection state between the common terminal 521 and the plurality of selection terminals 522. For example, the second switch 52 is controlled by the signal processing circuit 92. The second switch 52 electrically connects the common terminal 521 to at least one of the plurality of selection terminals 522 in accordance with a control signal from the RF signal processing circuit 93 in the signal processing circuit 92.

(2.8) External Connection Terminal

The plurality of external connection terminals 7 are terminals for allowing electrical connection with an external circuit (for example, the signal processing circuit 92), as illustrated in FIG. 4. The plurality of external connection terminals 7 include the antenna terminal 71, the plurality of (in the illustrated example, two) signal input terminals 72, the signal output terminal 73, and a ground terminal (not illustrated in drawings).

The antenna terminal 71 is connected to the antenna 91. In the high frequency module 1, the antenna terminal 71 is connected to the first switch 51. Furthermore, the antenna terminal 71 is connected to the plurality of transmission filters 12 and the plurality of reception filters 2 with the first switch 51 interposed therebetween.

The signal input terminals 72 are, for example, terminals through which transmission signals from an external circuit (for example, the signal processing circuit 92) are input to the high frequency module 1. In the high frequency module 1, each of the signal input terminals 72 corresponds to at least one of the plurality of power amplifiers 11 and is connected to the corresponding power amplifier 11.

The signal output terminal 73 is a terminal through which reception signals from the plurality of low-noise amplifiers 3 are output to an external circuit (for example, the signal processing circuit 92). In the high frequency module 1, the signal output terminal 73 is connected to the plurality of low-noise amplifiers 3 with the second switch 52 interposed therebetween.

(3) Structure of High Frequency Module

A structure of the high frequency module 1 according to this embodiment will be described below with reference to drawings.

The high frequency module 1 includes, as illustrated in FIGS. 1 to 3, the mounting board 6, the plurality of external connection terminals 7, the first resin layer 81, the second resin layer 82, and the shield layer 83.

The high frequency module 1 may be electrically connected to an external substrate (not illustrated in drawings). The external substrate corresponds to, for example, a mother board of a mobile phone, a communication apparatus, or the like. The state in which the high frequency module 1 may be electrically connected to an external substrate includes a case where the high frequency module 1 is indirectly mounted on the external substrate as well as the case where the high frequency module 1 is directly mounted on the external substrate. Furthermore, the case where the high frequency module 1 is indirectly mounted on the external substrate includes, for example, a case where the high frequency module 1 is mounted on another high frequency module mounted on the external substrate.

(3.1) Mounting Board

The mounting board 6 includes, as illustrated in FIG. 3, a first main surface 61 and a second main surface 62. The first main surface 61 and the second main surface 62 face each other in a thickness direction D1 of the mounting board 6. In the case where the high frequency module 1 is provided on an external substrate (not illustrated in drawings), the second main surface 62 faces the external substrate. The mounting board 6 is a double-sided mounting board in which electronic components are mounted on both the first main surface 61 and the second main surface 62.

The mounting board 6 is a multilayer substrate including a plurality of laminated dielectric layers. The mounting board 6 includes a plurality of conductive layers 63 and a plurality of through electrodes 64. The plurality of conductive layers 63 include a ground layer set to a ground potential. The plurality of through electrodes 64 are used for electrical connection between elements (including electronic components described above) mounted on both the first main surface 61 and the second main surface 62 and the conductive layers 63 of the mounting board 6. Furthermore, the plurality of through electrodes 64 are used for electrical connection between elements mounted on the first main surface 61 and elements mounted on the second main surface 62 and electrical connection between the conductive layers 63 of the mounting board 6 and the external connection terminals 7.

The plurality of power amplifiers 11 (see FIG. 4), the plurality of transmission filters 12, the plurality of reception filters 2, and the plurality of inductors 4 are arranged on the first main surface 61 of the mounting board 6.

The plurality of low-noise amplifiers 3 and the first switch 51 are arranged on the second main surface 62 of the mounting board 6. Furthermore, the plurality of external connection terminals 7 are arranged on the second main surface 62 of the mounting board 6.

(3.2) Power Amplifier

Although not illustrated in FIGS. 1 to 3, the power amplifiers 11 are mounted on the first main surface 61 of the mounting board 6. Part of the power amplifiers 11 may be mounted on the first main surface 61 of the mounting board 6, and the remaining part of the power amplifiers 11 may be mounted inside the mounting board 6. In short, the power amplifiers 11 are positioned closer to the first main surface 61 than the second main surface 62 at the mounting board 6 and at least part of the power amplifiers 11 is mounted on the first main surface 61.

(3.3) Transmission Filter

Each of the plurality of transmission filters 12 is, for example, an acoustic wave filter including a plurality of series-arm resonators and a plurality of parallel-arm resonators. The acoustic wave filter is, for example, a surface acoustic wave (SAW) filter using surface acoustic waves. Furthermore, each of the transmission filters 12 may include at least one of an inductor and a capacitor connected in series with any one of the plurality of series-arm resonators and may include an inductor or a capacitor connected in series with any one of the plurality of parallel-arm resonators.

The plurality of transmission filters 12 are mounted on the first main surface 61 of the mounting board 6, as illustrated in FIGS. 1 and 3. In the example of FIG. 1, each of the transmission filters 12 is mounted on the first main surface 61 of the mounting board 6. Part of the transmission filters 12 may be mounted on the first main surface 61 of the mounting board 6, and the remaining part of the transmission filters 12 may be mounted inside the mounting board 6. In short, the transmission filters 12 are positioned closer to the first main surface 61 than the second main surface 62 at the mounting board 6 and at least part of the transmission filters 12 is mounted on the first main surface 61.

A transmission filter 12 indicated by "Txn" (n represents a natural number) in FIG. 1 represents a transmission filter provided on a transmission path P1 (see FIG. 4) for a transmission signal of Band n. For example, a transmission filter 12 indicated by "Tx1" represents a transmission filter provided on a transmission path P1 for a transmission signal of Band 1.

(3.4) Reception Filter

Each of the plurality of reception filters 2 is, for example, an acoustic wave filter including a plurality of series-arm resonators and a plurality of parallel-arm resonators. The acoustic wave filter is, for example, a SAW filter using surface acoustic waves. Furthermore, each of the reception filters 2 may include at least one of an inductor and a capacitor connected in series with any one of the plurality of series-arm resonators and may include an inductor or a capacitor connected in series with any one of the plurality of parallel-arm resonators.

The plurality of reception filters 2 are arranged on the first main surface 61 of the mounting board 6, as illustrated in FIGS. 1 and 3. In the example of FIG. 1, each of the reception filters 2 is mounted on the first main surface 61 of the mounting board 6. Part of the reception filters 2 may be mounted on the first main surface 61 of the mounting board 6, and the remaining part of the reception filters 2 may be mounted inside the mounting board 6. In short, the reception filters 2 are positioned closer to the first main surface 61 than the second main surface 62 at the mounting board 6 and at least part of the reception filters 2 is mounted on the first main surface 61.

A reception filter 2 indicated by "Rxn" (n represents a natural number) in FIG. 1 represents a reception filter provided on a reception path P2 (see FIG. 4) for a reception signal of Band n. For example, a reception filter 2 indicated by "Rx30" represents a reception filter provided on a reception path P2 for a reception signal of Band 30. Furthermore, reception filters 2 indicated by "Rx1/3/25/66" represent reception filters provided on reception paths P2 for reception signals of Band 1, Band 3, Band 25, and Band 66.

(3.5) Inductor

The plurality of inductors 4 are mounted on the first main surface 61 of the mounting board 6, as illustrated in FIGS. 1 and 3. In the example of FIG. 1, each of the inductors 4 is mounted on the first main surface 61 of the mounting board 6. Part of the inductors 4 may be mounted on the first main surface 61 of the mounting board 6, and the remaining part of the inductors 4 may be mounted inside the mounting board 6. In short, the inductors 4 are positioned closer to the first main surface 61 than the second main surface 62 at the mounting board 6 and at least part of the inductors 4 is mounted on the first main surface 61.

An inductor 4 indicated by "Ln" (n represents a natural number) in FIG. 1 represents an inductor provided on a reception path P2 (see FIG. 4) for a reception signal of Band n. For example, an inductor 4 indicated by "L1" represents an inductor provided on a reception path P2 for a reception signal of Band 1.

(3.6) IC Component

As illustrated in FIGS. 2 and 3, the IC component 13 including the plurality of low-noise amplifiers 3, the first switch 51, and the second switch 52 is provided. That is, the IC component 13 includes the plurality of low-noise amplifiers 3, the first switch 51, and the second switch 52.

The IC component 13 is mounted on the second main surface 62 of the mounting board 6, as illustrated in FIGS. 2 and 3. In the example of FIG. 3, for example, the IC component 13 is arranged on the second main surface 62 of the mounting board 6. Part of the IC component 13 may be arranged on the second main surface 62 of the mounting board 6, and the remaining part of the IC component 13 may be mounted inside the mounting board 6. In short, the IC component 13 is positioned closer to the second main surface 62 than the first main surface 61 at the mounting board 6 and at least part of the IC component 13 is mounted on the second main surface 62.

(3.7) External Connection Terminal

The plurality of external connection terminals 7 are terminals for electrically connecting the mounting board 6 to an external substrate (not illustrated in drawings), as illustrated in FIGS. 2 and 3. The plurality of external connection terminals 7 include, as illustrated in FIG. 4, the antenna terminal 71, the plurality of signal input terminals 72, the signal output terminal 73, and a ground terminal (not illustrated in drawings).

The plurality of external connection terminals 7 are arranged on the second main surface 62 side of the mounting board 6. The plurality of external connection terminals 7 are electrodes of a columnar shape (for example, a cylindrical shape) provided on the second main surface 62 of the mounting board 6. For example, the plurality of external connection terminals 7 are made of metal (for example, copper, copper alloy, etc.). Each of the plurality of external connection terminals 7 includes, in the thickness direction D1 of the mounting board 6, a base end part that is bonded to the second main surface 62 of the mounting board 6 and a front end part that is opposite the base end part. Each of the front end parts of the plurality of external connection terminals 7 may include, for example, a gold plating layer.

In the high frequency module 1, the plurality of external connection terminals 7 are provided, from the view point of mountability of the high frequency module 1 on a mother board (not illustrated in drawings), increasing the number of ground terminals of the high frequency module 1, and the like.

(3.8) First Resin Layer, Second Resin Layer, and Shield Layer

The first resin layer 81 is arranged on the first main surface 61 of the mounting board 6, as illustrated in FIG. 3. The first resin layer 81 covers the plurality of transmission filters 12, the plurality of reception filters 2, and the plurality of inductors 4. The first resin layer 81 covers outer peripheral surfaces of electronic components (the transmission filters 12, the reception filters 2, and the inductors 4) and main surfaces of the electronic components that are farther away from the mounting board 6. The first resin layer 81 includes resin (for example, an epoxy resin). The first resin layer 81 may include filler as well as resin.

The second resin layer 82 covers the IC component 13 mounted on the second main surface 62 of the mounting board 6 and outer peripheral surfaces of the plurality of external connection terminals 7, as illustrated in FIG. 3. The second resin layer 82 includes resin (for example, an epoxy resin). The second resin layer 82 may include filler as well as resin. The second resin layer 82 may be made of the same material as the material of the first resin layer 81 or may be made of a material different from the material of the first resin layer 81.

The shield layer 83 covers the first resin layer 81, as illustrated in FIG. 3. The shield layer 83 has conductive characteristics. In the high frequency module 1, the shield layer 83 is provided for the purpose of electromagnetic shielding between the inside and outside the high frequency module 1. The shield layer 83 has a multilayer structure in which a plurality of metal layers are laminated. However, the shield layer 83 does not necessarily have a multilayer structure and may have a single metal layer structure. The metal layer includes one or a plurality of types of metals. The shield layer 83 covers a main surface of the first resin layer 81 that is farther away from the mounting board 6, an outer peripheral surface of the first resin layer 81, and an outer peripheral surface of the mounting board 6. Furthermore, the shield layer 83 also covers an outer peripheral surface of the second resin layer 82. The shield layer 83 is in contact with at least part of an outer peripheral surface of the ground layer of the mounting board 6. Thus, the potential of the shield layer 83 can be set to the same potential as that of the ground layer.

(3.9) Arrangement Relationship

The plurality of inductors 4 are collectively mounted on a part of the first main surface 61 of the mounting board 6, as illustrated in FIG. 1. A rectangular region A1 is formed as a region in which the plurality of inductors 4 are positioned.

In this embodiment, the rectangular region A1 is the smallest rectangular region in which a first inductor 4A and a second inductor 4B among the plurality of inductors 4 are positioned diagonally. The rectangular region A1 is the smallest rectangular region that is formed to enclose the outer peripheries of the first inductor 4A and the second inductor 4B.

The rectangular region A1 is a region enclosed by four sides A21 to A24. The side A21 is positioned at the left edges of the inductors 4 that are located furthest to the left in a first direction D21 among the plurality of inductors 4. The side A22 is positioned at the bottom edges of the inductors 4 that are located furthest to the bottom in a second direction D22 among the plurality of inductors 4. The side A23 is positioned at the right edges of the inductors 4 that are located furthest to the right in the first direction D21 among the plurality of inductors 4. The side A24 is positioned at the top edge of the inductor 4 that is located furthest to the top in the second direction D22 among the plurality of inductors 4.

In the example of FIG. 1, the side A21 is positioned at the left edges of the inductor 4 ("L1" in FIG. 1) for Band 1, the inductor 4 ("L66" in FIG. 1) for Band 66, the inductor 4 ("L3" in FIG. 1) for Band 3, the inductor 4 ("L25" in FIG. 1) for Band 25, the inductor 4 ("L30" in FIG. 1) for Band 30, and the inductor 4 ("L7" in FIG. 1) for Band 7. The side A22 is positioned at the bottom edges of the inductor 4 for Band 7 and the inductor 4 ("L41" in FIG. 1) for Band 41. The side A23 is positioned at the right edges of the inductor 4 ("L34" in FIG. 1) for Band 34, the inductor 4 ("L39" in FIG. 1) for Band 39, the inductor 4 ("L40" in FIG. 1) for Band 40, and the inductor 4 for Band 41. The side A24 is positioned at the top edge of the inductor 4 for Band 1.

On the first main surface 61 of the mounting board 6, the rectangular region A1 in which the plurality of inductors 4 are positioned overlaps with the IC component 13 when viewed in plan from the thickness direction D1 of the mounting board 6, as illustrated in FIGS. 1 to 3. The state in which "the rectangular region A1 overlaps with the IC component 13 when viewed in plan from the thickness direction D1 of the mounting board 6" includes a case where the entire rectangular region A1 overlaps with the entire IC component 13 when viewed in plan from the thickness direction D1 of the mounting board 6, a case where the entire rectangular region A1 overlaps with part of the IC component 13, a case where part of the rectangular region A1 overlaps with the entire IC component 13, and a case where part of the rectangular region A1 overlaps with part of the IC component 13. In short, the state in which "the rectangular region A1 overlaps with the IC component 13 when viewed in plan from the thickness direction D1 of the mounting board 6" represents a state in which "at least part of the rectangular region A1 overlaps with at least part of the IC component 13."

Accordingly, the distance between each of the plurality of inductors 4 and the corresponding low-noise amplifier 3 can be reduced. Thus, the total sum of wiring lengths between the inductors 4 and the low-noise amplifiers 3 can be reduced. The "total sum of wiring lengths between the inductors 4 and the low-noise amplifiers 3" represents the total sum of the wiring lengths between the plurality of inductors 4 and the low-noise amplifiers 3 corresponding to the plurality of inductors 4. In FIG. 4, the "total sum of wiring lengths between the inductors 4 and the low-noise amplifiers 3" represents the total sum of the wiring lengths between the ten inductors 4 and the corresponding low-noise amplifiers 3.

An electronic component that is closest to each of three or more sides out of the four sides A21 to A24 of the rectangular region A1 is at least one of the plurality of reception filters 2. In the example of FIG. 1, reception filters 2 are positioned closest to the three sides A21 to A23 out of the four sides A21 to A24 of the rectangular region A1. Specifically, the reception filters 2 ("Rx1/3/25/66" in FIG. 1) for Band 1, Band 3, Band 25, and Band 66 and the reception filter 2 ("Rx30" in FIG. 1) for Band 30 are positioned closest to the side A21. The reception filters 2 ("Rx7/41" in FIG. 1) for Band 7 and Band 41 are positioned closest to the side A22. The reception filters 2 ("Rx34/39" in FIG. 1) for Band 34 and Band 39 and the reception filter 2 ("Rx40" in FIG. 1) for Band 40 are positioned closest to the side A23.

Accordingly, the distance between each of the plurality of inductors 4 and the corresponding low-noise amplifier 3 can be reduced. Thus, the total sum of wiring lengths between the reception filters 2 and the inductors 4 can be reduced. The "total sum of wiring lengths between the reception filters 2 and the inductors 4" represents the total sum of the wiring lengths between the plurality of reception filters 2 and the inductors 4 corresponding to the plurality of reception filters 2. In FIG. 4, the "total sum of wiring lengths between the reception filters 2 and the inductors 4" represents the total sum of the wiring lengths between the ten reception filters 2 and the corresponding inductors 4.

Electronic components that are closest to sides of the rectangular region A1 include not only reception filters 2 that are separated from the sides A21 to A24 of the rectangular region A1 when viewed in plan from the thickness direction D1 of the mounting board 6 but also a reception filter 2 that overlaps with at least one of the sides A21 to A24 of the rectangular region A1 when viewed in plan from the thickness direction D1 of the mounting board 6. In other words, a reception filter 2 part of which is positioned inside the rectangular region A1 is also regarded as an electronic component that is closest to a side of the rectangular region A1.

Furthermore, in the case where a reception filter 2 overlaps with two sides of the rectangular region A1 when viewed in plan from the thickness direction D1 of the mounting board 6, the reception filter 2 is regarded as an electronic component that is closest to one side with which the reception filter 2 overlaps over a longer length than the other side.

Furthermore, a reception filter 2 that overlaps with the first switch 51 when viewed in plan from the thickness direction D1 of the mounting board 6 among the plurality of reception filters 2 is a filter that allows a reception signal of the highest frequency to pass through among the plurality of reception filters 2. In the example of FIG. 1, the reception filter 2 ("Rx7/41" in FIG. 1) for Band 7 (2620 MHz to 2690 MHz), which is the highest frequency, overlaps with the first switch 51 when viewed in plan from the thickness direction D1 of the mounting board 6.

At least one of the plurality of reception filters 2 is arranged between the rectangular region A1 and the transmission filters 12 when viewed in plan from the thickness direction D1 of the mounting board 6. In the example of FIG. 1, the reception filters 2 ("Rx1/3/25/66" in FIG. 1) for Band 1, Band 3, Band 25, and Band 66 and the reception filter 2 ("Rx30" in FIG. 1) for Band 30 are arranged between the rectangular region A1 and the transmission filters 12.

Accordingly, the distance between the transmission paths P1 on which the transmission filters 12 are provided and the inductors 4 provided on the reception paths P2 can be increased. Thus, the internal wiring of the transmission paths P1 and the internal wiring of the reception paths P2 can be separated away from each other. As a result, the isolation between the transmission paths P1 and the reception paths P2 can be improved. Furthermore, for example, by forming metal films in the reception filters 2, shielding can be achieved by the reception filters 2. Thus, degradation of reception NF caused by transmission can be reduced.

The plurality of reception filters 2 include an FDD reception filter 2 and a TDD reception filter 2. The FDD reception filter 2 is provided between the transmission filters 12 and the plurality of inductors 4. In contrast, the TDD reception filter 2 is provided between the plurality of inductors 4 and the shield layer 83 (see FIG. 3). In the example of FIG. 1, the reception filters 2 ("Rx1/3/25/66" in FIG. 1) for Band 1, Band 3, Band 25, and Band 66, which are FDD communication bands, and the reception filter 2 ("Rx30" in FIG. 1) for Band 30 are provided between the transmission filters 12 and the plurality of inductors 4. In contrast, the reception filters 2 ("Rx34/39" in FIG. 1) for Band 34 and Band 39, which are TDD communication bands, and the reception filter 2 ("Rx40" in FIG. 1) for Band 40 are provided between the plurality of inductors 4 and the shield layer 83 (see FIG. 3).

Accordingly, the FDD reception filters 2 can be placed close to the transmission filters 12 for the same communication bands. In the example of FIG. 1, the reception filters 2 for Band 1, Band 3, Band 25, and Band 66, which are FDD communication bands, can be placed close to the transmission filter 12 ("Tx1" in FIG. 1) for Band 1 and the transmission filter 12 ("Tx3" in FIG. 1) for Band 3.

(4) Detailed Structure of Component Elements of High Frequency Module (4.1) Mounting Board The mounting board 6 illustrated in FIGS. 1 to 3 is, for example, a multilayer substrate including the plurality of dielectric layers and the plurality of conductive layers 63. The plurality of dielectric layers and the plurality of conductive layers 63 are laminated in the thickness direction D1 of the mounting board 6. The plurality of conductive layers 63 are formed in predetermined patterns determined for individual layers. Each of the plurality of conductive layers 63 includes one or a plurality of conductor units on a plane that is orthogonal to the thickness direction D1 of the mounting board 6. Each of the conductive layers 63 is made of, for example copper. The plurality of conductive layers 63 include a ground layer. In the high frequency module 1, a plurality of external ground terminals and the ground layer are electrically connected with via conductors or the like of the mounting board 6 interposed therebetween. The mounting board 6 is, for example, a low temperature co-fired ceramics (LTCC) substrate. The mounting board 6 is not limited to an LTCC substrate and may be, for example, a printed wiring board, a high temperature co-fired ceramics (HTCC) substrate, or a resin multilayer substrate.

Furthermore, the mounting board 6 is not limited to an LTCC substrate and may be, for example, a wiring structure body. The wiring structure body is, for example, a multilayer structure body. The multilayer structure body includes at least one insulating layer and at least one conductive layer. The insulating layer is formed in a predetermined pattern. In the case where there are a plurality of insulating layers, the plurality of insulating layers are formed in predetermined patterns determined for individual layers. The conductive layer is formed in a predetermined pattern different from the predetermined pattern of the insulating layer. In the case where there are a plurality of conductive layers, the plurality of conductive layers are formed in predetermined patterns determined for individual layers. A conductive layer may include one or a plurality of rewiring parts. In the wiring structure body, a first surface of the two surfaces that face each other in the thickness direction of the multilayer structure body is the first main surface 61 of the mounting board 6, and a second surface of the wiring structure body is the second main surface 62 of the mounting board 6. The wiring structure body may be, for example, an interposer. The interposer may be an interposer including a silicon substrate or a substrate including multiple layers.

The first main surface 61 and the second main surface 62 of the mounting board 6 are separated away from each other in the thickness direction D1 of the mounting board 6 and intersect with the thickness direction D1 of the mounting board 6. For example, the first main surface 61 of the mounting board 6 intersects with the thickness direction D1 of the mounting board 6. However, for example, the first main surface 61 of the mounting board 6 may include a side face of a conductor unit or the like as a face that does not intersect with the thickness direction D1. Furthermore, for example, the second main surface 62 of the mounting board 6 intersects with the thickness direction D1 of the mounting board 6. However, for example, the second main surface 62 of the mounting board 6 may include a side face of a conductor unit or the like as a face that does not intersect with the thickness direction D1. Furthermore, fine roughness, recesses, or protrusions may be formed in the first main surface 61 and the second main surface 62 of the mounting board 6.

(4.2) Filter

The detailed structure of the transmission filters 12 and the reception filters 2 illustrated in FIG. 1 will be described. In the description provided below, the transmission filters 12 and the reception filters 2 will be described as filters without necessarily being distinguished from each other.

A filter is a single-chip filter. In the filter, for example, each of the plurality of series-arm resonators and the plurality of parallel-arm resonators is an acoustic wave resonator. In this case, the filter includes, for example, a substrate, a piezoelectric layer, and a plurality of interdigital transducer (IDT) electrodes. The substrate has a first surface and a second surface. The piezoelectric layer is provided on the first surface of the substrate. The piezoelectric layer is provided on a low acoustic velocity film. The plurality of IDT electrodes are provided on the piezoelectric layer. The low acoustic velocity film is provided directly or indirectly on the substrate. The piezoelectric layer is provided directly or indirectly on the low acoustic velocity film. The acoustic velocity of bulk waves propagating in the low acoustic velocity film is lower than the acoustic velocity of acoustic waves propagating in the piezoelectric layer. The acoustic velocity of bulk waves propagating in the substrate is higher than the acoustic velocity of acoustic waves propagating in the piezoelectric layer. The piezoelectric layer is made of, for example, lithium tantalate. The low acoustic velocity film is made of, for example, a silicon oxide. The substrate is, for example, a silicon substrate. The thickness of the piezoelectric layer is, for example, 3.5× or less, where the wavelength of an acoustic wave defined based on an electrode finger period of an IDT electrode is represented by $\lambda$. The thickness of the low acoustic velocity film is, for example, 2.0$\lambda$ or less.

The piezoelectric layer may be formed of, for example, lithium tantalate, lithium niobate, zinc oxide, aluminum nitride, or lead zirconate titanate. Furthermore, the low acoustic velocity film may include a material of at least one type selected from a group including silicon oxide, glass, silicon oxynitride, tantalum oxide, and a compound obtained by adding fluorine, carbon, or boron to silicon oxide. Furthermore, the substrate may include a material of at least one type selected from a group including silicone, aluminum nitride, aluminum oxide, silicon carbide, silicon nitride, sapphire, lithium tantalate, lithium niobate, quartz, alumina, zirconia, cordierite, mullite, steatite, forsterite, magnesia, and diamond.

The filter further includes, for example, a spacer layer and a cover member. The spacer layer and the cover member are provided on the first surface of the substrate. The spacer layer surrounds the plurality of IDT electrodes when viewed in plan from the thickness direction of the substrate. The spacer layer has a frame shape (rectangular frame shape) when viewed in plan from the thickness direction of the substrate. The spacer layer has electrical insulating characteristics. The spacer layer is made of, for example, synthetic resin such as epoxy resin or polyimide. The cover member has a flat plate shape. The cover member has a rectangular shape when viewed in plan from the thickness direction of the substrate. However, the cover member does not necessarily have a rectangular shape but may have, for example, a square shape. In the filter, the external size of the cover member, the external size of the spacer layer, and the external size of the cover member have substantially the same when viewed in plan from the thickness direction of the substrate. The cover member is arranged at the spacer layer in such a manner that the cover member faces the substrate in the thickness direction of the substrate. The cover member overlaps with the plurality of IDT electrodes in the thickness direction of the substrate and is separated away from the plurality of IDT electrodes in the thickness direction of the substrate. The cover member has electrical insulating characteristics. The cover member is made of, for example, synthetic resin such as epoxy resin or polyimide. The filter has a space surrounded by the substrate, the spacer layer, and the cover member. In the filter, the space is filled with gas. The gas is, for example, air, inert gas (for example, nitrogen gas), or the like. A plurality of terminals are exposed out of the cover member. Each of the plurality of terminals is, for example, a bump. The bump is, for example, a solder bump. The bump is not necessarily a solder bump and may be, for example, a gold bump.

The filter may include, for example, a close contact layer interposed between the low acoustic velocity film and the piezoelectric layer. The close contact layer is made of, for example, resin (epoxy resin or polyimide resin). Furthermore, the filter may include a dielectric film between the low acoustic velocity film and the piezoelectric layer, above the piezoelectric layer, or below the low acoustic velocity film.

The filter may include, for example, a high acoustic velocity film interposed between the substrate and the low acoustic velocity film. The high acoustic velocity film is provided directly or indirectly on the substrate. The low acoustic velocity film is provided directly or indirectly on the high acoustic velocity film. The piezoelectric layer is provided directly or indirectly on the low acoustic velocity film. The acoustic velocity of bulk waves propagating in the high acoustic velocity film is higher than the acoustic velocity of acoustic waves propagating in the piezoelectric layer. The acoustic velocity of bulk waves propagating in the low acoustic velocity film is lower than the acoustic velocity of acoustic waves propagating in the piezoelectric layer.

The high acoustic velocity film is made of diamond-like carbon, aluminum nitride, aluminum oxide, silicon carbide, silicon nitride, silicone, sapphire, a piezoelectric body, such as lithium tantalate, lithium niobate, or quartz, ceramics, such as alumina, zirconia, cordierite, mullite, steatite, or forsterite, magnesia, diamond, a material containing any of the materials mentioned above as a main component, or a material containing a mixture of materials mentioned above as a main component.

Regarding the thickness of the high acoustic velocity film, because the high acoustic velocity film has a function for causing acoustic waves to be confined in the piezoelectric layer and the low acoustic velocity film, it is desirable that the high acoustic velocity film be as thick as possible. The piezoelectric substrate may include a close contact layer, a dielectric film, and the like as films other than the high acoustic velocity film, the low acoustic velocity film, and the piezoelectric layer.

Each of the plurality of series-arm resonators and the plurality of parallel-arm resonators is not necessarily the acoustic wave resonator described above and may be, for example, a SAW resonator or a bulk acoustic wave (BAW) resonator. The SAW resonator includes, for example, a piezoelectric substrate and IDT electrodes provided on the piezoelectric substrate. In the case where each of the plurality of series-arm resonators and the plurality of parallel-arm resonators in a filter is a SAW resonator, the filter includes a plurality of IDT electrodes that correspond to the plurality of series-arm resonators in a one-to-one relationship and a plurality of IDT electrodes that correspond to the plurality of parallel-arm resonators in a one-to-one relationship on a single piezoelectric substrate. The piezoelectric substrate is, for example, a lithium tantalate substrate, a lithium niobate substrate, or the like.

(4.3) Power Amplifier

Although not illustrated in FIGS. 1 to 3, the power amplifier 11 is, for example, is a single-chip IC including a substrate and an amplification function unit. The substrate has a first surface and a second surface that face each other. The substrate is, for example, a gallium arsenide substrate. The amplification function unit includes at least one transistor formed on the first surface of the substrate. The amplification function unit is a functional unit that has a function for amplifying a transmission signal of a predetermined frequency band. The transistor is, for example, a heterojunction bipolar transistor (HBT). In the power amplifier 11, a power supply voltage from a power supply circuit (not illustrated in drawings) is applied between the collector and the emitter of the HBT. The power amplifier 11 may include, for example, a DC cut capacitor, in addition to the amplification function unit. The power amplifier 11 is flip-chip mounted on the first main surface 61 of the mounting board 6 in such a manner that the first surface of the substrate is near the first main surface 61 of the mounting board 6. The outer peripheral shape of the power amplifier 11 when viewed in plan from the thickness direction D1 of the mounting board 6 is a quadrangular shape.

(4.4) IC Component

The IC component 13 illustrated in FIG. 2 includes, as described above, the plurality of low-noise amplifiers 3, the first switch 51, and the second switch 52. The outer peripheral shape of the IC component 13 when viewed in plan from the thickness direction D1 of the mounting board 6 is a quadrangular shape.

The plurality of low-noise amplifiers 3 configure, for example, a single IC component including a substrate and an amplification function unit. The substrate has a first surface and a second surface that face each other. The substrate is, for example, a silicon substrate. The amplification function unit is formed on the first surface of the substrate. The amplification function unit is a functional unit that has a function for amplifying a reception signal of a predetermined frequency band. For example, the low-noise amplifiers 3 are each flip-flop mounted on the second main surface 62 of the mounting board 6 in such a manner that the first surface of the substrate is near the second main surface 62 of the mounting board 6.

The first switch 51 illustrated in FIG. 2 is, for example, a single-chip IC including a substrate and a switch function unit. The substrate has a first surface and a second surface that face each other. The substrate is, for example, a silicon substrate. The switch function unit includes a field effect transistor (FET) formed on the first surface of the substrate. The switch function unit is a functional unit that has a function for performing switching of a connection state. The first switch 51 is flip-flop mounted on the second main surface 62 of the mounting board 6 in such a manner that the first surface of the substrate is near the second main surface 62 of the mounting board 6.

The second switch 52 illustrated in FIG. 2 is, for example, a single-chip IC including a substrate and a switch function unit. The substrate has a first surface and a second surface that face each other. The substrate is, for example, a silicon substrate. The switch function unit includes a field effect transistor (FET) formed on the first surface of the substrate. The switch function unit is a functional unit that has a function for performing switching of a connection state. The second switch 52 is flip-flop mounted on the second main surface 62 of the mounting board 6 in such a manner that the first surface of the substrate is near the second main surface 62 of the mounting board 6.

(5) Communication Apparatus

The communication apparatus 9 includes, as illustrated in FIG. 4, the high frequency module 1, the antenna 91, and the signal processing circuit 92.

(5.1) Antenna

The antenna 91 is connected to the antenna terminal 71 of the high frequency module 1. The antenna 91 has a transmission function for emitting, as a radio wave, a transmission signal output from the high frequency module 1 and a reception function for receiving a reception signal as a radio wave from the outside and outputting the reception signal to the high frequency module 1.

(5.2) Signal Processing Circuit

The signal processing circuit 92 includes the RF signal processing circuit 93 and a baseband signal processing circuit 94. The signal processing circuit 92 processes signals passing through the high frequency module 1. More particularly, the signal processing circuit 92 processes transmission signals and reception signals.

The RF signal processing circuit 93 is, for example, a radio frequency integrated circuit (RFIC) and performs signal processing for high frequency signals.

The RF signal processing circuit 93 performs signal processing for high frequency signals output from the baseband signal processing circuit 94 and outputs the high frequency signals on which the signal processing has been performed to the high frequency module 1. Specifically, the RF signal processing circuit 93 performs signal processing such as up conversion for a transmission signal output from the baseband signal processing circuit 94, and outputs the transmission signal on which the signal processing has been performed to a transmission path P1 of the high frequency module 1.

The RF signal processing circuit 93 performs signal processing for high frequency signals output from the high frequency module 1 and outputs the high frequency signals on which the signal processing has been performed to the baseband signal processing circuit 94. Specifically, the RF signal processing circuit 93 performs signal processing for a reception signal output through a reception path P2 of the high frequency module 1, and outputs the reception signal on which the signal processing has been performed to the baseband signal processing circuit 94.

The baseband signal processing circuit 94 is, for example, a baseband integrated circuit (BBIC) and performs predetermined signal processing for transmission signals from the outside of the signal processing circuit 92. For example, reception signals that have been processed by the baseband signal processing circuit 94 are used as image signals for image display or used as audio signals for conversation.

Furthermore, the RF signal processing circuit 93 also has a function as a controller that controls connection of the first switch 51 and the second switch 52 of the high frequency module 1 on the basis of communication bands (frequency bands) used. Specifically, the RF signal processing circuit 93 performs switching of connection of the first switch 51 and the second switch 52 of the high frequency module 1 in accordance with a control signal (not illustrated in drawings). The controller may be provided outside the RF signal processing circuit 93. For example, the controller may be provided at the high frequency module 1 or the baseband signal processing circuit 94.

(6) Effects

In the high frequency module 1 according to this embodiment, the rectangular region A1 including the plurality of inductors 4 overlaps with the IC component 13 including the low-noise amplifiers 3 when viewed in plan from the thickness direction D1 of the mounting board 6, and an electronic component that is closest to each of three or more sides (in the example of FIG. 1, the sides A21 to A23) out of the four sides A21 to A24 of the rectangular region A1 is at least one of the plurality of reception filters 2. Accordingly, the total sum of wiring lengths between the reception filters 2 and the inductors 4 can be reduced, and the total sum of wiring lengths between the inductors 4 and the low-noise amplifiers 3 can be reduced. Thus, the total sum of the wiring lengths between the reception filters 2 and the low-noise amplifiers 3 can be reduced. As a result, wiring loss can be reduced.

In the high frequency module 1 according to this embodiment, the first switch 51 that performs switching to a reception filter 2 to be connected to the antenna terminal 71 from among the plurality of reception filters 2 is included in the IC component 13. Accordingly, the total sum of wiring lengths between the first switch 51 and the reception filters 2 can be reduced. Thus, the total sum of the wiring lengths between the reception filters 2 and the low-noise amplifiers 3 can further be reduced. As a result, wiring loss can further be reduced.

In the high frequency module 1 according to this embodiment, the second switch 52 that performs switching to a low-noise amplifier 3 to be connected to the signal output terminal 73 from among the plurality of low-noise amplifiers 3 is included in the IC component 13. Accordingly, compared to the case where the second switch 52 is provided separately from the first switch 51, the size of the high frequency module 1 can be reduced.

In the high frequency module 1 according to this embodiment, a reception filter 2 that overlaps with the first switch 51 among the plurality of reception filters 2 is a filter that allows a reception signal of the highest frequency to pass through among the plurality of reception filters 2. Accordingly, the wiring length of the reception filter 2 that is susceptible to be affected by wiring loss can be reduced.

In the high frequency module 1 according to this embodiment, the rectangular region A1 is the smallest rectangular region in which the first inductor 4A and the second inductor 4B are positioned diagonally, and the rectangular region A1 overlaps with the IC component 13 when viewed in plan from the thickness direction D1 of the mounting board 6. Accordingly, the total sum of the wiring lengths between the inductors 4 and the low-noise amplifiers 3 can further be reduced. Thus, the total sum of the wiring lengths between the reception filters 2 and the low-noise amplifiers 3 can further be reduced. As a result, wiring loss can further be reduced.

In the high frequency module 1 according to this embodiment, at least one of the plurality of reception filters 2 is arranged between the rectangular region A1 including the plurality of inductors 4 and the transmission filters 12 when viewed in plan from the thickness direction D1 of the mounting board 6. Accordingly, the distance between the transmission paths P1 on which the transmission filters 12 are provided and the inductors 4 provided on the reception paths P2 can be increased. Thus, the internal wiring of the transmission paths P1 and the internal wiring of the reception paths P2 can be separated away from each other. As a result, the isolation between the transmission paths P1 and the reception paths P2 can be improved. Furthermore, for example, by forming metal films in the reception filters 2, shielding can be achieved by the reception filters 2. Thus, degradation of reception NF caused by transmission can be reduced.

In the high frequency module 1 according to this embodiment, an FDD reception filter is provided between the transmission filters 12 and the plurality of inductors 4, and a TDD reception filter 2 is provided between the plurality of inductors 4 and the shield layer 83.

Accordingly, the FDD reception filter 2 can be placed close to the transmission filter 12 of the same communication band.

In the high frequency module 1 according to this embodiment, an electronic component that is closest to each of three or more sides (in the example of FIG. 1, the sides A21 to A23) out of the four sides A21 to A24 of the rectangular region A1 is at least one of the plurality of reception filters 2. Accordingly, the distance between the inductors 4 and the shield layer 83 can be increased. Thus, degradation of a Q value caused by interference between the inductors 4 and the shield layer 83 can be reduced.

(7) Modifications

Modifications of an embodiment will be described below.

(7.1) First Modification

Figure 5:
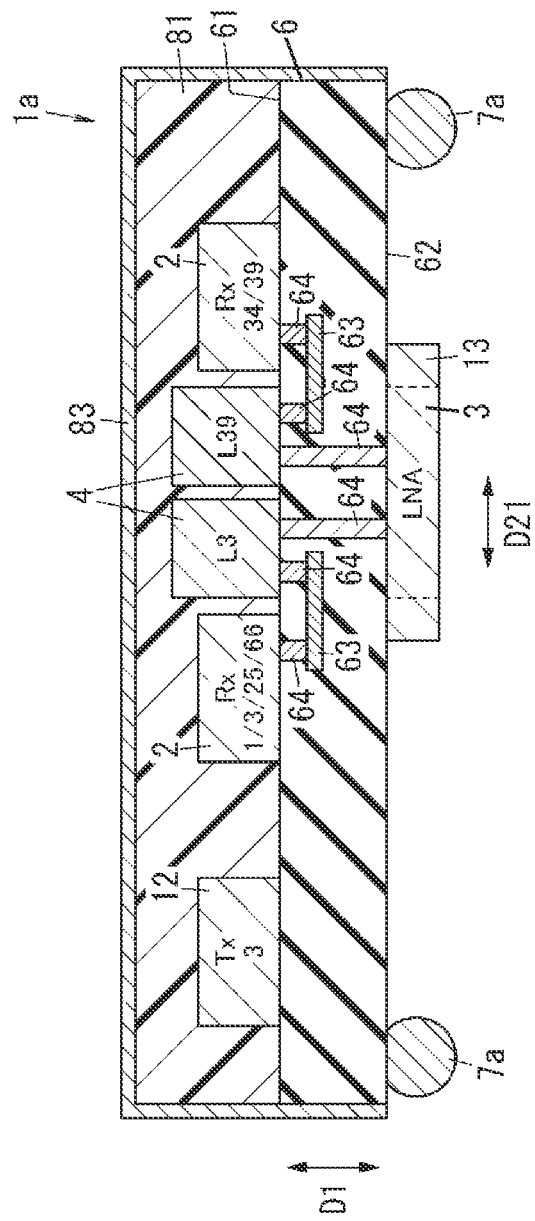
FIG. 5 is a cross-section view of a high frequency module according to a first modification of the embodiment.

According to a first modification of an embodiment, a high frequency module 1a may include a plurality of external connection terminals 7a as illustrated in FIG. 5, in place of the plurality of external connection terminals 7 (see FIG. 3).

The plurality of external connection terminals 7a are not columnar electrodes but have a bump structure. The plurality of external connection terminals 7a are arranged on the second main surface 62 of the mounting board 6. In the high frequency module 1a according to the first modification, the second resin layer 82 (see FIG. 3) is omitted.

(7.2) Second Modification

According to a second modification of the embodiment, in the high frequency module 1, an electronic component that is closest to each of the four sides A21 to A24 of the rectangular region A1 may be at least one of the plurality of reception filters 2.

In the high frequency module 1 according to the second modification, on each of the four sides A21 to A24 of the rectangular region A1, the distances between the inductors 4 and the shield layer 83 can be increased. Thus, degradation of a Q value caused by interference between the inductors 4 and the shield layer 83 can be reduced.

(7.3) Other Modifications

According to other modifications of the embodiment, each of the plurality of transmission filters 12 is not limited to a surface acoustic wave filter and may be a filter different from a surface acoustic wave filter. The transmission filters 12 may be, for example, acoustic wave filters using bulk acoustic waves (BAWs), LC resonant filters, or dielectric filters.

With each of the high frequency modules according to the above-mentioned modifications, effects similar to those achieved by the high frequency module 1 according to the embodiment can be achieved.

In the embodiments and the modifications described above, a state in which "A is mounted on a first main surface of a mounting board" includes a state in which A is arranged in a space near the first main surface out of the space near the first main surface and a space near a second main surface that are separated by the mounting board, as well as a state in which A is directly mounted on the first main surface of the mounting board. That is, the state in which "A is mounted on the first main surface of the mounting board" includes a state in which A is mounted on the first main surface with other circuit elements, electrodes, or the like interposed therebetween.

The embodiments and the modifications described above are merely part of various embodiments and modifications of the present disclosure. Furthermore, various changes may be made to the embodiments and the modifications in accordance with design of the present disclosure.

(Aspects)

Aspects described below are disclosed in this specification.

A high frequency module (1; 1a) according to a first aspect includes a mounting board (6), a plurality of inductors (4), a plurality of reception filters (2), and an IC component (13). The mounting board (6) has a first main surface (61) and a second main surface (62) that face each other. The plurality of inductors (4) are mounted on the first main surface (61) of the mounting board (6). The plurality of reception filters (2) are mounted on the first main surface (61) of the mounting board (6). The IC component (13) is mounted on the second main surface (62) of the mounting board (6) and includes a low-noise amplifier (3). Each of the plurality of inductors (4) corresponds to part of the plurality of reception filters (2) and is connected to a corresponding reception filter (2) and the low-noise amplifier (3). A rectangular region (A1) in which the plurality of inductors (4) are positioned overlaps with the IC component (13) when viewed in plan from a thickness direction (D1) of the mounting board (6). An electronic component that is closest to each of three or more sides out of four sides (A21 to A24) of the rectangular region (A1) is at least one of the plurality of reception filters (2).

In the high frequency module (1; 1a) according to the first aspect, the total sum of wiring lengths between the reception filters (2) and the inductors (4) can be reduced, and the total sum of wiring lengths between the inductors (4) and the low-noise amplifiers (3) can be reduced. Thus, the total sum of the wiring lengths between the reception filters (2) and the low-noise amplifiers (3) can be reduced. As a result, wiring loss can be reduced.

According to a second aspect, the high frequency module (1; 1a) according to the first aspect further includes an antenna terminal (71). The IC component (13) further includes a first switch (51). The first switch (51) performs switching to a reception filter (2) to be connected to the antenna terminal (71) from among the plurality of reception filters (2).

In the high frequency module (1; 1a) according to the second aspect, the total sum of wiring lengths between the first switch (51) and the reception filters (2) can be reduced. Thus, the total sum of the wiring lengths between the reception filters (2) and the low-noise amplifiers (3) can further be reduced. As a result, wiring loss can further be reduced.

According to a third aspect, the high frequency module (1; 1a) according to the second aspect further include a signal output terminal (73). The signal output terminal (73) is a terminal through which a reception signal is output to an external circuit. The IC circuit (13) includes a plurality of low-noise amplifiers (3). The IC component (13) further includes a second switch (52). The second switch (52) performs switching to a low-noise amplifier (3) to be connected to the signal output terminal (73) from among the plurality of low-noise amplifiers (3).

In the high frequency module (1; 1a) according to the third aspect, the size of the high frequency module (1; 1a) can be reduced, compared to the case where the second switch (52) is provided separately from the first switch (51).

According to a fourth aspect, in the high frequency module (1; 1a) according to the second or third aspect, a reception filter (2) that overlaps with the first switch (51) when viewed in plan from the thickness direction (D1) of the mounting board (6) among the plurality of reception filters (2) is a filter that allows a reception signal of the highest frequency to pass through among the plurality of reception filters (2).

In the high frequency module (1; 1a) according to the fourth aspect, the wiring length of the reception filter (2) that is susceptible to be affected by wiring loss can be reduced.

According to a fifth aspect, in the high frequency module (1; 1a) according to any one of the first to fourth aspects, the plurality of inductors (4) include a first inductor (4A) and a second inductor (4B). The rectangular region (A1) is the smallest rectangular region in which the first inductor (4A) and the second inductor (4B) are positioned diagonally. The rectangular region (A1) overlaps with the IC component (13) when viewed in plan from the thickness direction (D1) of the mounting board (6).

In the high frequency module (1; 1a) according to the fifth aspect, the total sum of wiring lengths between the inductors (4) and the low-noise amplifiers (3) can further be reduced. Thus, the total sum of the wiring lengths between the reception filters (2) and the low-noise amplifiers (3) can further be reduced. As a result, wiring loss can further be reduced.

According to a sixth aspect, the high frequency module (1; 1a) according to any one of the first to fifth aspects further includes a transmission filter (12). The transmission filter (12) is mounted on the first main surface (61) of the mounting board (6). At least one of the plurality of reception filters (2) is arranged between the rectangular region (A1) and the transmission filter (12) when viewed in plan from the thickness direction (D1) of the mounting board (6).

In the high frequency module (1; 1a) according to the sixth aspect, the distance between a transmission path (P1) on which the transmission filter (12) is provided and the inductor (4) provided on a reception path (P2) can be increased. Thus, internal wiring of the transmission path (P1) and internal wiring of the reception path (P2) can be separated away from each other. As a result, the isolation between the transmission path (P1) and the reception path (P2) can be improved. Furthermore, for example, by forming a metal film in the reception filter (2), shielding can be achieved by the reception filter (2). Thus, degradation of reception NF caused by transmission can be reduced.

According to a seventh aspect, the high frequency module (1; 1a) according to the sixth aspect further includes a shield layer (83). The plurality of reception filters (2) include an FDD reception filter and a reception filter dedicated to reception. The FDD reception filter is provided between the transmission filter (12) and the plurality of inductors (4). The reception filter dedicated to reception is provided between the plurality of inductors (4) and the shield layer (83).

In the high frequency module (1; 1a) according to the seventh aspect, the FDD reception filter (2) can be placed close to the transmission filter (12) of the same communication band.

According to an eighth aspect, in the high frequency module (1; 1a) according to any one of the first to seventh aspects, an electronic component that is closest to each of the four sides (A21 to A24) of the rectangular region (A1) is at least one of the plurality of reception filters (2).

In the high frequency module (1; 1a) according to the eighth aspect, degradation of a Q value caused by interference between the inductors (4) and the shield layer (83) can be reduced.

A communication apparatus (9) according to a ninth aspect includes the high frequency module (1; 1a) according to any one of the first to eighth aspects and a signal processing circuit (92). The signal processing circuit (92) processes a signal passing through the high frequency module (1; 1a).

In the communication apparatus (9) according to the ninth aspect, in the high frequency module (1; 1a), the total sum of wiring lengths between the reception filters (2) and the inductors (4) can be reduced and the total sum of wiring lengths between the inductors (4) and the low-noise amplifiers (3) can be reduced. Thus, the total sum of the wiring lengths between the reception filters (2) and the low-noise amplifiers (3) can be reduced. As a result, wiring loss can be reduced.

REFERENCE SIGNS LIST 1, 1a high frequency module
11 power amplifier
12 transmission filter
13 IC component
2 reception filter
3 low-noise amplifier
4 inductor
4A first inductor
4B second inductor
51 first switch
511 common terminal
512 selection terminal
52 second switch
521 common terminal
522 selection terminal
6 mounting board
61 first main surface
62 second main surface
63 conductive layer
64 through electrode
7, 7a external connection terminal
71 antenna terminal
72 signal input terminal
73 signal output terminal
81 first resin layer
82 second resin layer
83 shield layer
9 communication apparatus
91 antenna
92 signal processing circuit
93 RF signal processing circuit
94 baseband signal processing circuit
A1 rectangular region
A21 to A24 side
P1 transmission path
P2 reception path
D1 thickness direction
D21 first direction
D22 second direction

The invention claimed is:

1. A high frequency module comprising:
a mounting board that has a first main surface and a second main surface facing each other;
a plurality of inductors that are mounted on the first main surface of the mounting board;
a plurality of reception filters that are mounted on the first main surface of the mounting board; and
an integrated circuit (IC) component that is mounted on the second main surface of the mounting board and that comprises a low-noise amplifier,
wherein each of the plurality of inductors corresponds to part of the plurality of reception filters, and is connected to a corresponding reception filter and the low-noise amplifier,
wherein the plurality of inductors are mounted in a rectangular region that overlaps the IC component in a plan view of the mounting board,
wherein at least one of the plurality of reception filters is closest to each of three or more sides of the rectangular region, and
wherein the plurality of reception filters are mounted outside of the rectangular region in the plan view of the mounting board.

2. The high frequency module according to claim 1, further comprising:
an antenna terminal,
wherein the IC component further comprises a first switch that is configured to switch connection of the antenna terminal between the plurality of reception filters.

3. The high frequency module according to claim 2, further comprising:
a signal output terminal through which a reception signal is output to an external circuit,
wherein the IC component further comprises:
a plurality of low-noise amplifiers, and
a second switch that is configured to switch connection of the signal output terminal between the plurality of low-noise amplifiers.

4. The high frequency module according to claim 2, wherein a reception filter that overlaps with the first switch in the plan view is configured to pass a reception signal of a highest frequency among the plurality of reception filters.

5. The high frequency module according to claim 1, wherein the plurality of inductors comprises:
a first inductor; and
a second inductor, and
wherein the rectangular region is the smallest rectangular region comprising the first inductor and the second inductor mounted diagonally to each other, and overlaps the IC component in the plan view.

6. A high frequency module comprising:
a mounting board that has a first main surface and a second main surface facing each other;
a plurality of inductors that are mounted on the first main surface of the mounting board;
a plurality of reception filters that are mounted on the first main surface of the mounting board;
an integrated circuit (IC) component that is mounted on the second main surface of the mounting board and that comprises a low-noise amplifier; and
a transmission filter that is mounted on the first main surface of the mounting board,
wherein each of the plurality of inductors corresponds to part of the plurality of reception filters, and is connected to a corresponding reception filter and the low-noise amplifier, wherein the plurality of inductors are mounted in a rectangular region that overlaps the IC component in a plan view of the mounting board, wherein at least one of the plurality of reception filters is closest to each of three or more sides of the rectangular region, and wherein at least one of the plurality of reception filters is mounted between the rectangular region and the transmission filter in the plan view.

7. The high frequency module according to claim 6, further comprising:

a shield layer, wherein the plurality of reception filters comprises:
a frequency division duplex (FDD) reception filter, and
a time division duplex (TDD) reception filter, wherein the FDD reception filter is mounted between the transmission filter and the plurality of inductors, and wherein the TDD reception filter is mounted between the plurality of inductors and the shield layer.

8. The high frequency module according to claim 1, wherein at least one of the plurality of reception filters is closest to each of the four sides of the rectangular region.

9. A communication apparatus comprising:

the frequency module according to claim 1; and a signal processing circuit configured to process a signal passing through the high frequency module.

* * * * *